US006331485B1

(12) United States Patent
Miyamoto

(10) Patent No.: US 6,331,485 B1
(45) Date of Patent: Dec. 18, 2001

(54) METHOD OF PRODUCING SEMICONDUCTOR DEVICE

(75) Inventor: Takaaki Miyamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 1354 days.

(21) Appl. No.: 08/606,975

(22) Filed: Feb. 26, 1996

Related U.S. Application Data

(63) Continuation of application No. 08/280,450, filed on Jul. 26, 1994, now abandoned.

(30) Foreign Application Priority Data

Jul. 30, 1993 (JP) .................................................... 5-190120

(51) Int. Cl.[7] .................................................... H01L 21/44
(52) U.S. Cl. ......................... 438/653; 438/654; 438/656; 438/680
(58) Field of Search ................................ 437/190, 192, 437/245, 246; 257/751, 753, 761, 763; 438/653, 654, 656, 680

(56) References Cited

U.S. PATENT DOCUMENTS

| 4,782,380 | * | 11/1988 | Shankar et al. .................. 437/190 |
| 4,897,709 | * | 1/1990 | Yokoyama et al. ............... 437/190 |
| 4,960,732 | * | 10/1990 | Dixit et al. ....................... 437/192 |
| 5,173,327 | * | 12/1992 | Sandhu et al. .................... 427/573 |
| 5,296,404 | * | 3/1994 | Akahozi et al. .................. 437/173 |
| 5,508,066 | * | 4/1996 | Akahori ............................ 427/571 |

OTHER PUBLICATIONS

Monthly Semiconductor World, Jan. 1993, pp. 145–151, "Cleaning with hydrazine and the development of TiN–CVD Film" by T. Oba.
Nicollet, M., "Diffusion Barriers in Thin Films", *Thin Solid Films*, 52(1978), pp. 415–443.*

* cited by examiner

Primary Examiner—T. N. Quach
(74) Attorney, Agent, or Firm—Ronald P. Kananen; Rader, Fishman & Grauer

(57) ABSTRACT

A method for producing semiconductor device for reducing a gas of halogenated product of a group IVB element with $H_2$ by the ECR plasma CVD method to form a thin film of the group IVB element on a substrate is disclosed. This method includes forming an adhesion layer of the group IVB element in a contact hole, including walls, to be in contact with the exposed substrate, the adhesion layer being formed by reducing with $H_2$ a gas of a halogenated product of the group IVB element in an ECR plasma CVD process, the group IVB element and $H_2$ being used at a flow ratio of 0.4 and greater; forming a barrier layer in contact with the adhesion layer; and filling the contact hole with an electrically conductive material. The stable barrier metal is formed and an upper-layer metallization material is filled within the minute contact hole having a large aspect ratio.

8 Claims, 3 Drawing Sheets

METHOD OF PRODUCING SEMICONDUCTOR DEVICE

This application is a continuation-in-part of application Ser. No. 08/280,450 filed Jul. 26, 1994, abandoned.

BACKGROUND OF THE INVENTION

1. Field of the Invention

This invention relates to a method of metallization of a semiconductor device. More particularly, this invention relates to a method for producing a highly reliable contact part, which is adapted for improving conformality of a thin film of a group IVB element, preferably a Ti film employed as a barrier metal, by the electron cyclotron resonance (ECR) plasma CVD method.

2. Description of the Related Art

For filling a metallization material into a contact hole of recent VLSI or ULSI, particularly a contact hole for having substrate-contact with an impurity diffused region in a Si substrate, aluminum (Al) and tungsten (W) are broadly used as an electrically conductive material for filling.

In order to enhance reliability of contact by these filling metals, the inner wall of the contact hole is covered with a barrier metal composed of the group IVB element before filling. A barrier metal which has a two-layer structure consisting of a titanium (Ti) film and a titanium nitride (TiN) film is employed as the above-mentioned barrier metal. The barrier metal having a; two-layer structure is employed for providing a Ti film having a capability for reducing a natural oxidation film on the substrate of the Si substrate to assure ohmic property, and for stacking a TiN film thereon to assure barrier property.

The Ti film and TiN film are formed generally by sputtering. The process for forming the latter TiN film is particularly called "reactive sputtering", in which a Ti target is sputtered in a nitrogen-containing atmosphere.

However, with the sputtering method, the step coverage in a recent contact hole having a high aspect ratio is insufficient. Grains of a film forming material sputtered out from the target are incident on the substrate with a certain directionality. Therefore, the travelling grains are prevented from reaching deep inside of the hole by a shadowing effect from the sidewalls of the contact hole itself.

Thus, the CVD method is expected to be promising as it is capable of forming the barrier metal with a satisfactory coverage on the basis of chemical reactions of the surface in the contact hole.

The TiN film can be formed relatively easily by a known process using various material gases and the CVD method. For instance, an example of forming the TiN film based on methylhydrazine reduction of $TiCl_4$ using a low pressure CVD device with parallel flat plate single-wafer processing is reported in Monthly Semiconductor World, January 1993, pages 145–151. The formation Gibbs energy in this reaction system of TiN at normal temperatures is approximately −209 kJ/mol ($\Delta G<0$). The system is thermodynamically stable.

On the contrary, the reaction system of film formation of the Ti film by the CVD method is limited to $H_2$ reduction of $TiCl_4$ as far as it is known. In addition, the forming Gibbs energy in the reaction system as shown by the following formula is 209 kJ/mol ($\Delta G>0$), which is very high, at temperatures within a range of 100 to 1000° C. for currently practical semiconductor processes.

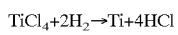
$$TiCl_4 + 2H_2 \rightarrow Ti + 4HCl$$

Therefore, film formation of the Ti film by the conventional CVD method has rarely been realized.

Recently, a technique of forming the Ti film by the ECR plasma CVD method utilizing ECR discharge of high dissociation efficiency of material gases has been proposed instead of the conventional heat CVD method.

However, the Ti film formation by this method is not satisfactory in religibility and reproducibility. For instance, if the Ti film grows into grains, not conformal, under certain conditions, the TiN film growing thereon inherits the surface profile of the Ti film, thus further increasing surface irregularities of the barrier metal. Consequently, problems arise, such as generation of a crack in a corner part on the bottom of the contact hole, and difficulty in filling the contact hole with an upper-layer metallization material in the latter process. The Ti film is a critical component for assuring the ohmic property of the contact. The conformality of the Ti film is a requirement for assuring reliability of the contact part.

OBJECT AND SUMMARY OF THE INVENTION

It is an object of the present invention to provide a method for producing a semiconductor device which is adapted for improving conformality of the Ti film formed by the ECR plasma CVD method and for improving reliability of the contact part.

According to the present invention, there is provided a method for producing a semiconductor device including the steps of: forming an insulating layer on a substrate; forming a contact hole in the insulating layer to expose a selected portion of the substrate, the contact hole being defined by walls of the insulating layer; forming an adhesion layer of a group IVB element in the contact hole, including the walls, to be in contact with the exposed substrate, the adhesion layer being formed by reducing with $H_2$ a gas of a halogenated product of the group IVB element in an ECR plasma CVD process, the group IVB element and $H_2$ being used at a flow ratio of 0.4 and greater; forming a barrier layer in contact with the adhesion layer; and filling the contact hole with an electrically conductive material.

If the flow ratio of the group IVB element to $H_2$ is smaller than 0.4, grain growth of Ti is observed in a fine contact hole. Although the upper limit of the flow ratio is not particularly defined, an excessively large flow ratio may lower the reduction capability of $H_2$, disturbing achievement of practical film forming speed. Therefore, the flow ratio is selected in a range approximately up to 2.

After a thin film of the group IBV element is formed, a nitride film of the group IVB element may be continuously formed on the thin film.

The nitride film may be formed by the CVD method or in a self-aligned manner by annealing the thin-film of the group IVB element in a nitrogen-containing atmosphere.

The group IVB element includes three types, of elements that is, Ti, zirconium (Zr) and hafnium (Hf). Forming the Ti film using a $TiCl_4$ gas is particularly effective.

In an experiment, when the flow ratio of a $TiCl/H_2$ mixed gas was set to 0.4 or greater, conformal formation of the Ti film was possible. On the contrary, at a flow ratio of the $TiCl/H_2$ mixed gas of 0.4 or smaller, grain growth of Ti was observed. The reason for the above results is conceivably as follows. Because an excessive amount of by-products, such as HCl, are generated near the bottom of the fine contact hole in the atmosphere containing an excessive amount of $H_2$, vapor pressures in a micro ambient are lowered and release thereof is restricted. Consequently, individual Ti crystalline nuclei grow extraordinarily. From the above phenomenon, it is conceivable that the quantity balance of the by-products from the viewpoint of the vapor pressure can be improved at the flow ratio of 0.4 and greater, and that other Ti crystalline nuclei are sequentially formed on the substrate before the individual crystalline nuclei grow extraordinarily, thus realizing conformality.

As the Ti film is thus formed conformally, even when a TiN film is stacked on the Ti film by the CVD method, a film inheriting the property of the underlying film can be grown. Thus, a risk of generating a crack in the corner part of the contact hole is eliminated.

If the Ti film is annealed in a nitrogen-containing atmosphere, the TiN film is formed conformally and in a self-aligned manner.

BRIEF DESCRIPTION OF THE DRAWINGS

FIGS. 1A to 1D are cross-sectional views of an example of a series of processes, sequentially shown, in which the method of the present invention is applied to filling a contact hole wherein FIG. 1A shows a state in which the contact hole is closed with an $SiO_2$ interlayer insulating film; FIG. 1B shows a state in which a Ti film is formed conformally by the ECR plasma CVD method; FIG. 1C shows a state in which a TiN film is formed conformally; FIG. 1D shows a state in which the contact hole is uniformly filled with an upper-layer metallization film.

FIGS. 2A to 2C are cross-sectional views of another example of a series of processes, sequentially shown, in which the method of the present invention is applied to filling the contact hole; wherein FIG. 2A shows a state in which a conformal Ti film is formed to cover the contact hole; FIG. 2B shows a state in which a conformal TiN film and a $TiSi_2$ layer are formed in a self-aligned manner by a nitriding anneal; FIG. 2C shows a state in which the contact hole is uniformly filled with an upper-layer metallizatio n film.

FIGS. 3A and 3B are cross-sectional views of a comparative example of filling the contact hole, sequentially shown, wherein FIG. 3A shows a state in which a granular Ti film has grown within the contact hole; FIG. 3B shows a state in which a TiN film having large surface irregularities has grown on the Ti film.

DETAILED DESCRIPTION OF THE PREFERRED EMBODIMENTS

Preferred embodiments of the present invention will now be described in detail with reference to the accompanying drawings.

EXAMPLE 1

The present example is of the contact hole filling process. In this example, a Ti film was formed by the ECR plasma CVD method at a $TiCl_4/H_2$ flow ratio of 0.8, and then a TiN film was similary continuously formed by the ECR plasma CVD method. Finally, the contact hole was filled with a Al-1% Si film. This process will be explained with reference to FIGS. 1A to 1D.

Figure 1A:
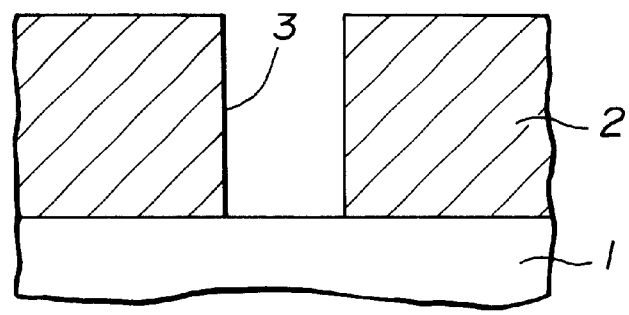

A sample wafer used in th is example has a contact hole 3 with a diameter of approximately 0.3 μm opened in an $SiO_2$ interlayer insulating film 2 with a thickness of approximately 1 μm deposited on an Si substrate 1, as shown in FIG. 1A. Therefore, the contact hole 3 exhibits an aspect ratio of 3 or greater. However, the aspect ratio is expressed in a compressed manner in FIGS. 1A to 1D.

The wafer was set on an ECR plasma CVD device, and a Ti film with a thickness of 2 to 10 nm was formed under the following conditions.

| | |
|---|---|
| $TiCl_4$ flow rate | 24 SCCM |
| $H_2$ flow rate | 30 SCCM |
| gas pressure | 0.12 Pa |
| microwave power | 2.8 kW (2.45 GHz) |
| film forming temperature | 420° C. |

Figure 1B:
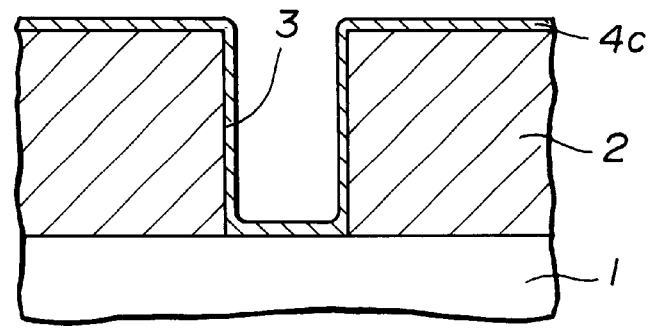

By setting the above conditions, a Ti film 4c for conformally covering the inner wall surface of the contact hole was formed, as shown in FIG. 1B. The subscript "c" indicates conformality hereinbelow.

Next, a TiN film was continuously formed in the same device. Exemplary film forming conditions are shown as follows.

| | |
|---|---|
| $TiCl_4$ flow rate | 20 SCCM |
| $H_2$ flow rate | 26 SCCM |
| $N_2$ flow rate | 6 SCCM |
| gas pressure | 0.23 Pa |
| microwave power | 2.8 kW (2.45 GHz) |
| film forming temperature | 420° C. |

Figure 1C:
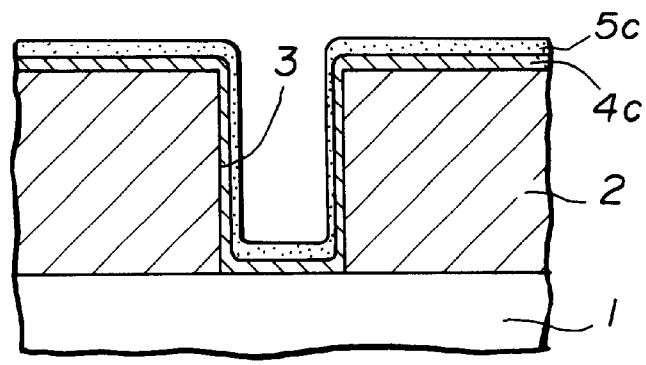

In this process, a TiN film 5c reflecting the profile of the conformal underlying Ti film 4c and being similarly conformal was formed, as shown in FIG. 1C. Cracks and defects at the corners of the bottom of the contact hole 3 were not observed.

Figure 1D:
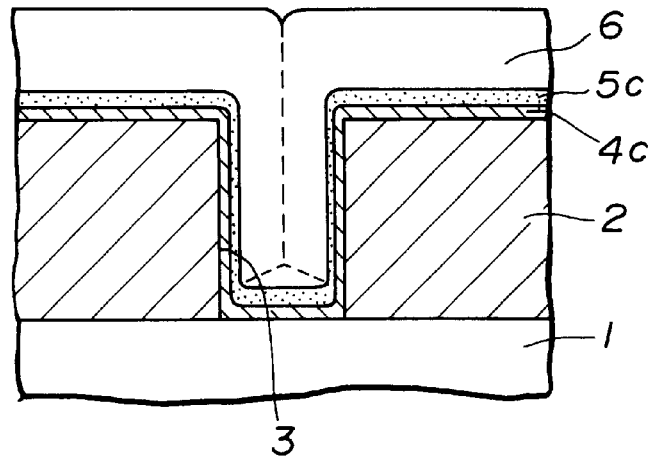

The contact hole 3 thus having a satisfactory barrier metal formed thereto was uniformly filled with an upper-layer metallization film 6, as shown in FIG. 1D. As the upper-layer metallization film 6 in this example, an Al-1% Si film formed by high-temperature sputtering or a tungsten (W) film formed by the blanket CVD method can be used. In either case, satisfactory results were obtained.

EXAMPLE 2

In the present example, a Ti film was conformally formed, and then the Ti film was annealed in a nitrogen-containing atmosphere to form a TiN film in a self-aligned manner. This process will be described with reference to FIGS. 2A to 2C. Reference numerals of FIGS. 2A to 2C are partly the same as those of FIGS. 1A to 1D.

Figure 2A:
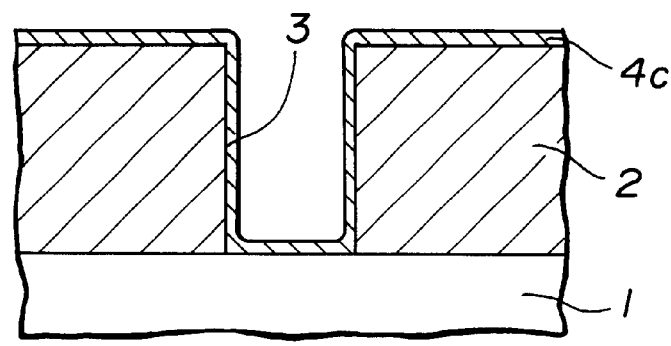

First, a wafer as shown in FIG. 2A, having a Ti film 4c formed thereon in a manner similar to Example 1, was set on an annealing device and was nitrided at annealing temperatures of 500 to 900° C. for an annealing time of 30 to 120 seconds in an $N_2$ atmosphere or an ammonium ($NH_3$) atmosphere.

Figure 2B:
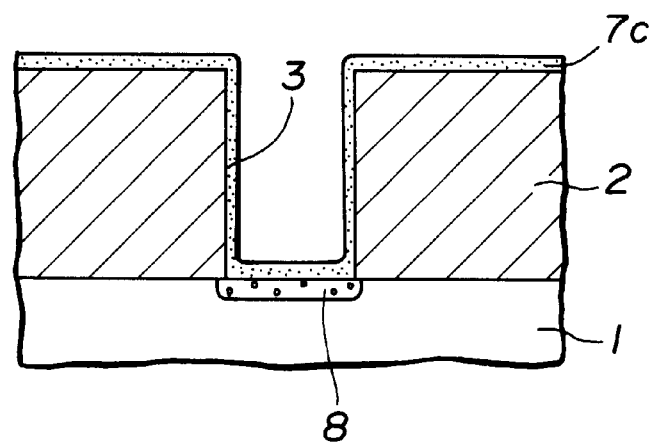
Figure 2C:
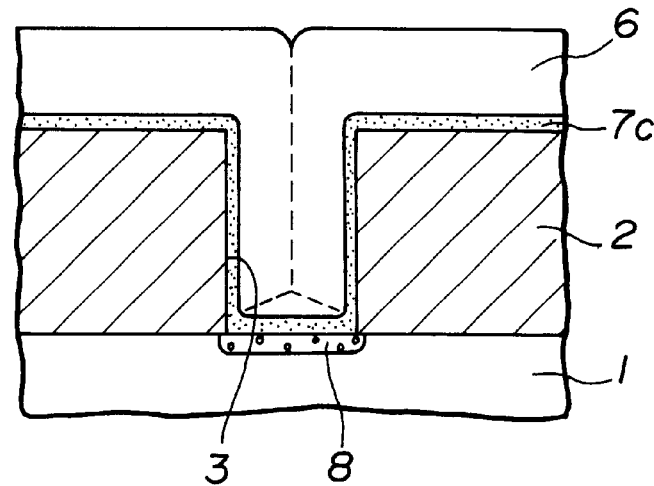

By this nitriding anneal, the Ti film 4c was changed into a TiN film 7c on an $SiO_2$ interlayer insulating film 2, as shown in FIG. 2B.

A major part of the Ti film 4c was changed into the TiN film 7c on the bottom of the contact hole 3, and a titanium/silicide ($TiSi_2$) layer 8 was formed in a self-aligned manner on the boundary face with the Si substrate 1. This $TiN/TiSi_2$ two-layer structure was generated for the following reasons. Since TiN having a formation Gibbs energy of −336.6 kJ/mol is thermodynamically more stable than $TiSi_2$ having a formation Gibbs energy of −134.4 kJ/mol, the nitriding of the Ti film on the bottom of the contact hole 3 precedes the silicification thereof, and the resulting TiN film 7c serves as a barrier to external diffusion of Si. By this process, formation of the barrier metal and ohmic contact were simultaneously achieved.

On the TiN film 7c which was conformally formed, the contact hole 3 was stably filled with the upper-layer metallization film 6, as shown in FIG. 2C. Thus, a low-resistance contact was realized.

Comparative Example

In the present comparative example, a Ti film was formed at a TiCl$_4$/H$_2$ flow rate of 0.2, and a TiN film was subsequently formed thereon. This process will be explained with reference to FIGS. 3A and 3B.

First, the wafer as previously shown in FIG. 1A was set on an ECR plasma CVD device, and a Ti film 4c with a thickness of 2 to 10 nm was formed under the following conditions.

| | |
|---|---|
| TiCl$_4$ flow rate | 6 SCCM |
| H$_2$ flow rate | 30 SCCM |
| gas pressure | 0.12 Pa |
| microwave power | 2.8 kW (2.45 GHz) |
| film forming temperature | 420° C. |

Figure 3A:
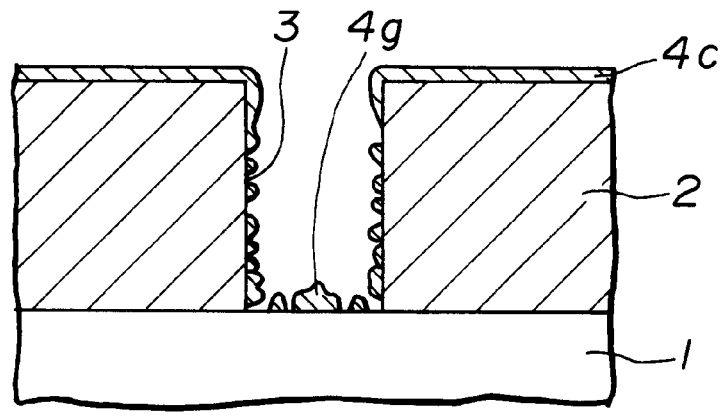

Under the above conditions, a conformal Ti film 4c was formed in the extreme vicinity of the upper surface of the SiO$_2$ interlayer insulating film 2 and at the opening end of the contact hole 3, as shown in FIG. 3A. However, a granular Ti film 4g grew on the sidewall surface to the bottom. The subscript "g" indicates that the Ti film is granular. The above phenomenon is generated conceivably because an excessive amount of H$_2$ in the film forming gas prevents reaction by-products from being released, causing Ti crystal nuclei to grow extraordinarily.

Figure 3B:
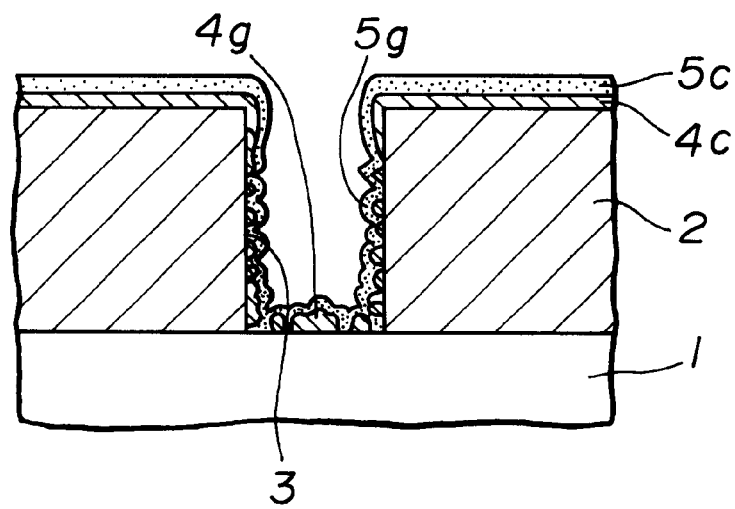

If a TiN film was subsequently formed thereon by the ECR plasma CVD method, conformal TiN film 5c grew on the conformal Ti film 4c, as shown in FIG. 3B. However, a granular TiN film 5g grew on the granular Ti film 4g, intensifying the surface irregularities. Also, a crack was generated in the corner part on the bottom of the contact hole 3.

The upper-layer metallization film, not shown, was not filled uniformly on such a non-uniform barrier metal, and sufficient ohmic contact was not achieved. Also, a leak current was increased by the crack.

The present invention is described above on the basis of the two examples. However, it is to be understood that the present invention is not limited to these examples, and that details of the structure of the sample wafer and the film forming conditions may be suitably modified.

For instance, the structure of the barrier metal is not limited to the above-described Ti/TiN two-layer structure. A Ti/TiN/Ti three-layer structure having another Ti film stacked on the two-layer structure may also be employed.

In the above embodiment, the contact hole filling process is explained. A similar filling process is effective for a via hole.

As is clear from the above description, according to the present invention, a conformal Ti film can be formed stably by the ECR plasma CVD method. Thus, a barrier metal can be stably formed and an upper-layer metallization material can be filled even within a fine contact hole having a large aspect ratio. Consequently, a semiconductor device having highly reliable metallization can be produced.

What is claimed is:

1. A method for filling a contact hole in a wafer having an insulating film deposited on a substrate and defining a contact hole having walls formed in said insulating film and being in contact with said substrate, comprising the steps of:

forming a layer of a metal element selected from the group consisting of Ti, Zr, and Hf by an ECR plasma CVD method by reducing a gas of a halogenated product of the metal element with H$_2$ at an effective flow ratio of the former gas to H$_2$ of approximately 0.8, thus conformally covering an inner wall surface of the contact hole without forming cracks or defects at corners of a bottom of said contact hole;

forming a barrier layer; and filling the contact hole with an electrically conductive material.

2. The method of claim 1 wherein said halogenated product of said metal element is TiCl$_4$, and said barrier layer is formed of TiN.

3. The method of claim 2 wherein said contact hole has a diameter of approximately 0.3 micrometers in an insulating film having a thickness of approximately 1.0 micrometers.

4. The method of claim 2 further including the step of annealing said Ti film in a nitrogen-containing atmosphere for forming said TiN film in a self-aligned manner.

5. The method as set forth in claim 4 wherein said step of annealing produces a TiN film on the bottom of the contact hole and a titanium/silicide layer formed in a self-aligned matter on a boundary face with the substrate.

6. The method of claim 1 wherein said barrier laver is formed of a nitride of said metal element.

7. The method of claim 1 wherein said electrically conductive material is Al-1% Si film.

8. The method of claim 1 wherein said contact hole has a diameter of approximately 0.3 micrometers in an insulating film having a thickness of approximately 1.0 micrometers.

* * * * *

UNITED STATES PATENT AND TRADEMARK OFFICE
CERTIFICATE OF CORRECTION

PATENT NO. : 6,331,485 B1 Page 1 of 1
DATED : December 18, 2001
INVENTOR(S) : Takaaki Miyamoto It is certified that error appears in the above-identified patent and that said Letters Patent is hereby corrected as shown below:

<u>Column 6,</u>
Line 46, "laver" should read -- layer --

Signed and Sealed this

Fourth Day of June, 2002

Attest:

Attesting Officer

JAMES E. ROGAN
*Director of the United States Patent and Trademark Office*